(12) United States Patent
Kim

(10) Patent No.: US 8,400,847 B2
(45) Date of Patent: Mar. 19, 2013

(54) SEMICONDUCTOR INTEGRATED CIRCUIT FOR GENERATING CLOCK SIGNALS

(75) Inventor: Ki-Tae Kim, Ichon (KR)

(73) Assignee: SK hynix Inc. (KR)

( * ) Notice: Subject to any disclaimer, the term of this patent is extended or adjusted under 35 U.S.C. 154(b) by 0 days.

(21) Appl. No.: 13/204,588

(22) Filed: Aug. 5, 2011

(65) Prior Publication Data

US 2011/0286285 A1    Nov. 24, 2011

Related U.S. Application Data

(62) Division of application No. 12/345,783, filed on Dec. 30, 2008, now Pat. No. 8,009,486.

(30) Foreign Application Priority Data

Jun. 24, 2008 (KR) .................. 10-2008-0059843

(51) Int. Cl.
*G11C 7/10* (2006.01)

(52) U.S. Cl. .................. 365/189.05; 365/233; 365/233.5

(58) Field of Classification Search ............. 365/189.05, 365/233, 233.5, 222, 226, 194, 230.06, 230.08, 365/189.17, 189.04, 201, 51, 63
See application file for complete search history.

(56) References Cited

U.S. PATENT DOCUMENTS

| 6,545,941 | B2 | 4/2003 | Kato et al. | |
|---|---|---|---|---|
| 6,985,041 | B2 | 1/2006 | Wong et al. | |
| 7,320,082 | B2 | 1/2008 | Tsern et al. | |
| 2002/0145930 | A1* | 10/2002 | Bando | 365/222 |
| 2004/0085832 | A1* | 5/2004 | Kanda et al. | 365/200 |
| 2005/0195674 | A1 | 9/2005 | Jang | |
| 2007/0002661 | A1* | 1/2007 | Chu et al. | 365/226 |
| 2008/0298159 | A1* | 12/2008 | Kawabata et al. | 365/233.5 |
| 2008/0303494 | A1 | 12/2008 | Nakakubo | |

FOREIGN PATENT DOCUMENTS

| KR | 1020040018850 A | 3/2004 |
|---|---|---|
| KR | 1020040066511 A | 7/2004 |

* cited by examiner

*Primary Examiner* — Dang Nguyen

(74) *Attorney, Agent, or Firm* — Baker & McKenzie LLP

(57) ABSTRACT

A semiconductor integrated circuit device includes a write-read clock control signal generating unit that activates a read clock control signal and a write clock control signal in response to one of a write operational mode and a read operational mode after maintaining the read clock control signal and the write clock control signal at a deactivation state in response to one of an idle mode and a refresh operational mode, and a clock buffer that generates a read clock signal and a write clock signal in response to a clock signal, the read clock control signal, and the write clock control signal.

5 Claims, 4 Drawing Sheets

SEMICONDUCTOR INTEGRATED CIRCUIT FOR GENERATING CLOCK SIGNALS

CROSS-REFERENCES TO RELATED APPLICATION

The present application is a divisional application of U.S. patent application Ser. No. 12/345,783 entitled "Semiconductor integrated circuit for generating clock signals" filed Dec. 30, 2008 which claims priority under 35 U.S.C. §119(a) to Korean application number 10-2008-0059843, filed on Jun. 24, 2008, in the Korean Intellectual Property Office, both of which are incorporated herein by reference in their entirety as if set forth in full.

BACKGROUND

1. Technical Field

The embodiments described herein relate to a semiconductor integrated circuit (IC) device and, more particularly, to a semiconductor IC device capable of generating clock signals.

2. Related Art

Generally, high-speed synchronous dynamic random access memory (SDRAM) devices employ write clock signals independently from read clock signals. In order to reduce current consumption, dedicated clocks are selectively activated in response to a read operation or a write operation.

FIG. 1 is a schematic block diagram of a conventional semiconductor IC device including a clock buffer. In FIG. 1, the clock generator 1 includes a write clock buffer 10 and a read clock buffer 20, wherein the write clock buffer 10 receives an external clock signal 'CLK' to generate a write clock signal 'WT_CLK'. The read clock buffer 20 receives the external clock signal 'CLK' to generate a read clock signal 'RD_CLK'. Accordingly, the write clock signal 'WT_CLK' and the read clock signal 'RD_CLK' can be activated in response to the external clock signal 'CLK'. However, reset operational modes of the write clock signal 'WT_CLK' and the read clock signal 'RD_CLK' are controlled in different manners.

As shown in FIG. 1, the write clock signal 'WT_CLK' is reset in response to only a refresh signal 'REF' for the purpose of a specific test. The read clock signal 'RD_CLK' is reset in response to an idle operational mode signal 'IDLE', as well as the refresh signal 'REF'. Thus, the idle mode includes a precharge mode and a power down mode, wherein, in the idle mode, the semiconductor IC device is not operated. For example, if the idle mode includes a test mode to drive a write circuit part (not shown), then the write clock signal must be driven even in the idle mode. Accordingly, the write clock signal 'WT_CLK' is continuously provided even in the idle mode, so that the standby current of the semiconductor IC device is increased.

SUMMARY

A semiconductor IC capable of reducing current consumption is described herein.

In one aspect, a semiconductor integrated circuit device includes a write-read clock control signal generating unit that activates a read clock control signal and a write clock control signal in response to one of a read operational mode and a write operational mode after maintaining the read clock control signal and the write clock control signal at a deactivation state in response to one of an idle mode and a refresh operational mode, and a clock buffer that generates a read clock signal and a write clock signal in response to a clock signal, the read clock control signal, and the write clock control signal.

In another aspect, a semiconductor integrated circuit device includes a write-read clock control signal generating unit that generates a read clock control signal and a write clock control signal activated in response to an operational mode in which a column address signal is input, a clock buffer that generates a read clock signal and a write clock signal having a period substantially identical to a period of a clock signal while the read clock control signal and the write clock control signal are being activated, and a latency control unit that generates a read latency signal and a write latency signal in response to the read clock signal and the write clock signal.

In another aspect, a semiconductor integrated circuit device includes a write-read clock control signal generating unit that generates a read clock control signal and a write clock control signal deactivated in an active operational mode after an idle mode and a refresh operational mode, a clock buffer that generates a read clock signal and a write clock signal by dividing a path of a clock signal in response to the read clock control signal and the write clock control signal, and a latency control unit that generates a read latency signal and a write latency signal in response to the read clock control signal and the write clock control signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
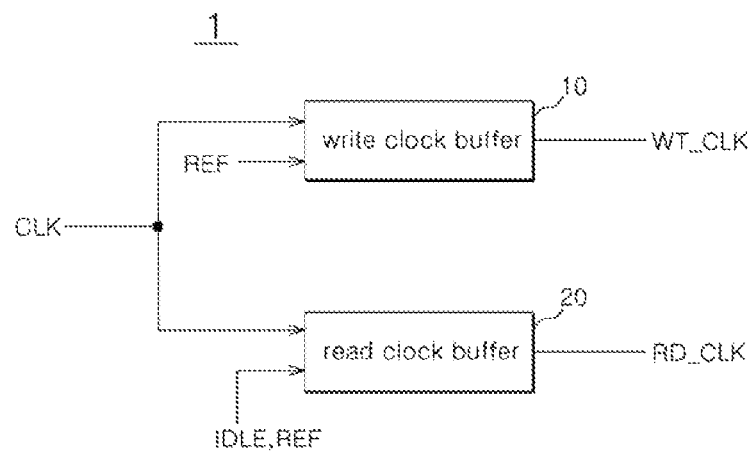
FIG. 1 is a schematic block diagram of a conventional semiconductor IC device including a clock buffer.
Figure 2:
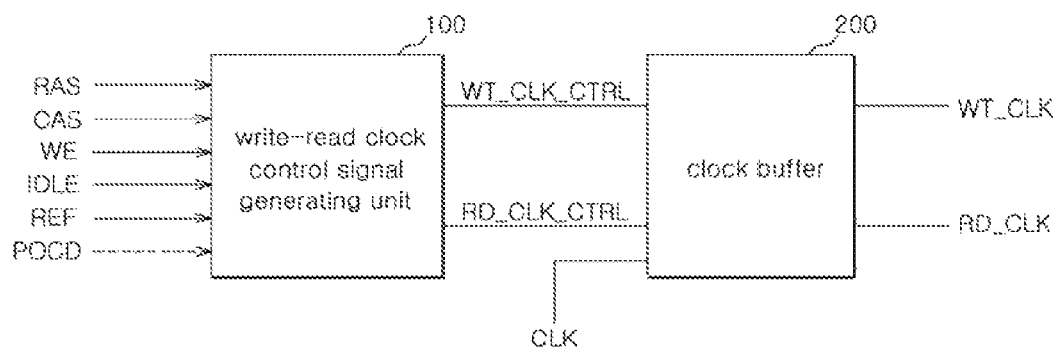
FIG. 2 is a schematic block diagram of an exemplary semiconductor IC device generating a read/write clock signal according to one embodiment.

FIG. 2 is a schematic block diagram of an exemplary semiconductor IC device generating read/write clock signal according to one embodiment. In FIG. 2, the semiconductor IC device 101 can be configured to include a write-read clock control signal generating unit 100 and a clock buffer 200. The write-read-read clock control signal generating unit 100 can supply a read clock control signal 'RD_CLK_CTRL' and a write clock control signal 'WT_CLK_CTRL' that are activated in response to a read operational mode or a write operational mode according to combinations of commands. For example, the write-read clock control signal generating unit 100 can generate the read clock control signal 'RD_CLK_C-TRL' and the write clock control signal 'WT_CLK_CTRL' that can be activated in an input operational mode of a column address signal. Here, the write-read clock control signal generating unit 100 can supply the read clock control signal 'RD_CLK_CTRL' and the write clock control signal 'WT_CLK_CTRL' that are deactivated in response to an idle mode, i.e., a precharge mode or a power down mode, or in response to a refresh operational mode to disable a read operation or a write operation. In addition, the write-read clock control signal generating unit 100 can also receive a test mode signal 'POCD', wherein the write-read clock control signal generating unit 100 can generate the write clock control signal 'WT_CLK_CTRL' in response to the specific test mode signal 'POCD', as described below.

In FIG. 2, the clock buffer 200 can generates a read clock signal 'RD_CLK' and a write clock signal 'WT_CLK' in response to a clock signal 'CLK', the read clock control signal 'RD_CLK_CTRL', and the write clock control signal 'WT_CLK_CTRL', and. The clock buffer 200 can generate the read clock signal 'RD_CLK' or the write clock signal 'WT_CLK' having substantially the same cycle frequency as a frequency of the clock signal 'CLK' while the read clock control signal 'RD_CLK_CTRL' or the write clock control signal 'WT_CLK_CTRL' is being activated. Thus, the read clock signal 'RD_CLK' and the write clock signal 'WT_CLK' can be deactivated in the idle mode, thereby reducing a standby current of the semiconductor IC device 101.

Figure 3:
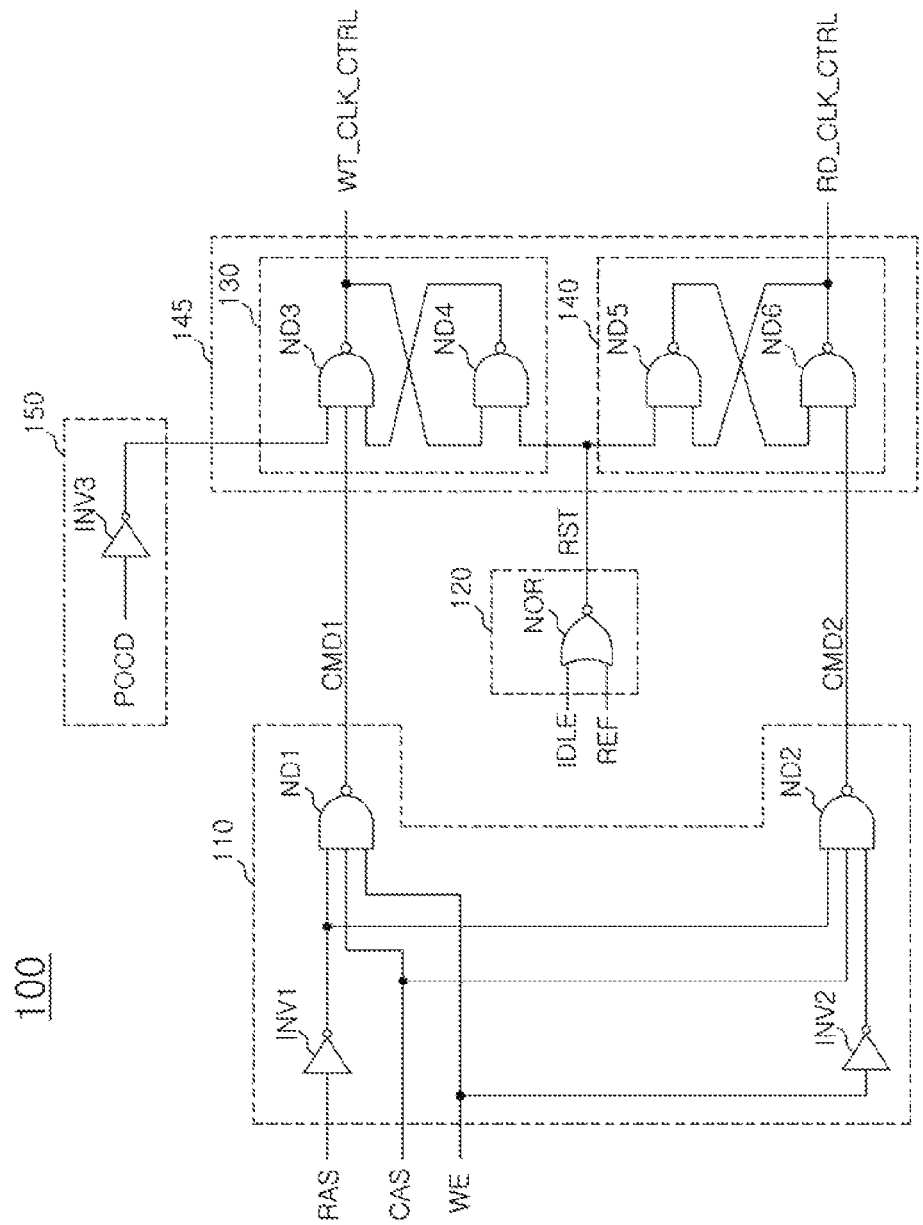
FIG. 3 is a schematic circuit diagram of an exemplary write-read clock control signal generating unit that can be included in the device of FIG. 2 according to one embodiment.

FIG. 3 is a schematic circuit diagram of an exemplary write-read clock control signal generating unit of FIG. 2 according to one embodiment. In FIG. 3, the write-read clock control signal generating unit 100 can be configured to include a set-up unit 110, a reset unit 120, and a latch unit 145. The set-up unit 110 can generate first and second command control signals 'CMD1' and 'CMD2' activated in response to the read operational mode or the write operational mode. For example, the set-up unit 110 can combine a signal 'RAS', a signal 'CAS', and a write signal 'WE' with each other. If the combination of the signal 'RAS', the signal 'CAS', and the write signal 'WE' correspond to one of an active operational mode, a read operational mode, or a write operational mode, then the set-up unit 110 can activate the first and second command control signals 'CMD1' and 'CMD2'. Although not shown, the signal 'RAS', the signal 'CAS', and the write signal 'WE' can have inverted signal levels applied to external pins (/RAS), (/CAS), and (/WE), respectively, of the semiconductor IC device 101.

The set-up unit 110 can include first and second inverters INV1 and INV2, and first and second NAND gates ND1 and ND2, wherein the first inverter INV1 can invert the signal 'RAS'. Accordingly, the first NAND gate ND1 can generate the first command control signal 'CMD1' by combining an inverted signal of the signal 'RAS', the signal 'CAS', and the write signal 'WE'. The second inverter INV2 can invert the write signal 'WE'. Thus, the second NAND gate ND2 can generate the second command control signal 'CMD2' by combining the inverted signal of the signal 'RAS', the signal 'CAS', and an inverted signal of the write signal 'WE'.

The reset unit 120 can generate a reset signal 'RST' that can be activated in response to the idle mode or the refresh operational mode to reset an output signal of the latch unit 145. The reset unit 120 can include a NOR gate NOR. Accordingly, when receiving one of an idle mode signal 'IDLE' and a refresh signal 'REF', which can be activated at a high level, the reset unit 120 can generate the activated reset signal 'RST'. Although not shown, the idle mode signal 'IDLE' can be obtained by combining a precharge mode signal and a power down mode signal. Thus, the idle mode signal 'IDLE' may be activated in response to the precharge mode or the power down mode.

In FIG. 3, the latch unit 145 can include first and second latch units 130 and 140. Here, the latch unit 145 can maintain the write clock control signal 'WT_CLK_CTRL' and the read clock control signal 'RD_CLK_CTRL' at an activation state if the activated first and second command control signal 'CMD1' and 'CMD2' are received. Thereafter, if the activated reset signal 'RST' is received, then the latch unit 145 can deactivate the write clock control signal 'WT_CLK_CTRL' and the read clock control signal 'RD_CLK_CTRL'.

The first latch unit 130 can generate the write clock control signal 'WT_CLK_CTRL' in response to the first command control signal 'CMD1' and the reset signal 'RST'. The first latch unit 130 can include third and fourth NAND gates ND3 and ND4 connected to each other in a flip-flop configuration. Accordingly, the first latch unit 130 can determine a signal level of the write clock control signal 'WT_CLK_CTRL' in response to the first command control signal 'CMD1', while receiving the reset signal 'RST' that is deactivated.

The second latch unit 140 can generate the read clock control signal 'RD_CLK_CTRL' in response to both the second command control signal 'CMD2' and the reset signal 'RST'. Here, the second latch unit 140 can include fifth and sixth NAND gates ND5 and ND6 connected to each other in a flip-flop configuration similar to the configuration of the first latch unit 130. Accordingly, the second latch unit can determine a signal level of the read clock control signal 'RD_CLK_CTRL' in response to the second command control signal 'CMD2', while receiving the reset signal 'RST' that is deactivated.

In FIG. 3, the write-read clock control signal generating unit 100 can further include a test mode applying unit 150. Here, the test mode applying unit 150 can include a third inverter INV3 receiving an off-chip driver (OCD) test signal 'POCD'.

As described above, the write-read clock control signal generating unit 100 can generate the write clock control signal 'WT_CLK_CTRL' in response to a specific test mode signal, i.e., the OCD test mode signal 'POCD'. For example, the write-read clock control signal generating unit 100 may generate the write clock control signal 'WT_CLK_CTRL' at an activated level in response to an activated level of the OCD test signal 'POCD'.

Generally, the OCD test can check for variations and input impedance of an input driver in order to adjust the input impedance. For example, the input impedance of the input driver may not be uniform due to a clock skew caused by variations resulting from process parameters. Accordingly, the input impedance can be adjusted by using the OCD test. In order to test an OCD, since a write circuit unit (not shown) needs to be driven by a predetermined write command in the idle mode, the write clock control signal 'WT_CLK_CTRL' needs to be activated. However, according to the present embodiment, in order to check an output impedance of an output driver as the OSD test, the read clock control signal 'RD_CLK_CTRL' may be activated in response to an OSD test mode signal.

An exemplary operation of the write-read clock control signal generating unit 100 will be described. Table <1> shows voltage levels applied to principal pins and output signal levels of principal circuit portions in order to explain exemplary operations of the write-read clock control signal generating unit 100. Referring to FIG. 3 and Table 1, the operation of the write-read clock control signal generating unit 100 will be described.

TABLE 1

| Signal and circuit unit | /RAS (pin) | /CAS (pin) | /WE (pin) | RAS | CAS | WE | CMD1 | CMD2 | RST | WT_CLK_CTRL | RD_CLK_CTRL |
|---|---|---|---|---|---|---|---|---|---|---|---|
| ACTIVE OP MODE | L | H | H | H | L | L | H | H | H | No variation (maintain previous state) | No variation (maintain previous state) |
| WRITE OP MODE | H | L | L | L | H | H | L | L | H | H | No variation (maintain previous state) |
| READ OP MODE | H | L | H | L | H | L | H | L | H | No variation (maintain previous state) | H |

In the active operational mode, the reset unit 120 can continuously generate an output signal having a high level. In addition, the test mode applying unit 150 can generate a high-level signal. Accordingly, in the active operational mode, a low level, a high level, and a high level can be applied to the external pins (/RAS), (/CAS), and (/WE) according to a Joint Electron Device Engineering Council (JEDEC) specification.

As described above, since the signal 'RAS', the signal 'CAS', and the write signal 'WE' can have inverted signal levels compared to the levels applied to the external pins, the signal 'RAS', the signal 'CAS', and the write signal 'WE' can have a high level signal, a low level signal, and a low level signal, respectively. Thus, the first NAND gate ND1 can generate the first command control signal 'CMD1' having a high level in response to low levels. Accordingly, since the third and fourth NAND gates ND3 and ND4 can receive a high level signal and a high level signal, respectively, the first latch unit 130 can generate the write clock control signal 'WT_CLK_CTRL' having a previous state according to a flip-flop operation.

For example, the write clock control signal 'WT_CLK_CTRL' may have a level corresponding to the previous state. In addition, the second NAND gate ND2 can generate the second command control signal 'CMD2' having a high level in response to a low level signal. Accordingly, since the fifth and sixth NAND gates ND5 and ND6 can receive a high level signal and a high level signal, respectively, the second latch unit 140 can generate the read clock control signal 'RD_CLK_CTRL' having a previous state according to a flip-flop operation.

In a write operational mode, the external pins (/RAS), (/CAS), and (/WE) can receive a high level signal, a low level signal, and a low level signal, respectively, according to the JEDEC specification. Accordingly, the signal 'RAS', the signal 'CAS', and the write signal 'WE' can have a low level signal, a high level signal, and a high level signal, respectively. Thus, the first NAND gate ND1 can receive all high level signals to generate the first command control signal 'CMD1' having a low level.

In FIG. 3, and as demonstrated in Table 1, the first latch unit 130 can generate the write clock control signal 'WT_CLK_CTRL' having a high level that can be activated in response to a low level signal. In addition, the second NAND gate ND2 can receive a high level signal, a high level signal, and a low level signal to generate the second command control signal 'CMD2' having a high level. Since the fifth and sixth NAND gates ND5 and ND6 can receive a high level signal and a high level signal, respectively, the second latch unit 140 can generate the read clock control signal 'RD_CLK_CTRL' maintaining a previous state according to a flip-flop operation.

The above principle operations can be also be applied to a read operational mode. Accordingly, in the read operational mode, the write clock control signal 'WT_CLK_CTRL' maintaining a previous state can be generated, and the read clock control signal 'RD_CLK_CTRL' maintaining an activation state can be generated. Accordingly, if one of the idle mode signal 'IDLE', which represents the idle mode, and the refresh operational mode signal 'REF', which represents the refresh operational mode, is activated at a high level, then the reset signal 'RST' can be generated at an activated low level. Thus, in the case of the idle mode or the refresh operational mode, the latch unit 145 can be reset to generate the deactivated write clock control signal 'WT_CLK_CTRL' and the deactivated read clock control signal 'RD_CLK_CTRL'.

In the case of an OCD test mode, the write clock control signal 'WT_CLK_CTRL' can be activated in response to the activated OCD test mode signal 'POCD'. For example, even though the write clock control signal 'WT_CLK_CTRL' can be deactivated due to the idle mode before the OCD test mode, the write clock control signal 'WT_CLK_CTRL' can be activated in response to the OCD test mode signal 'POCD'. The OCD test mode signal 'POCD' can be generated from a mode resistor set (MRS).

As described above, since the write-read clock control signal generating unit 100 can include the latch unit 145 having a flip-flop configuration, the read clock control signal 'RD_CLK_CTRL' and the write clock control signal 'WT_CLK_CTRL' can be maintained at a deactivated state in the idle mode or the refresh operational mode until a next read operational mode or a next write operational mode is reached. In addition, the write clock control signal 'WT_CLK_CTRL' and the read clock control signal 'RD_CLK_CTRL' can be maintained at a previous state in an active operational mode. Accordingly, if the write-read clock control signal generating unit 100 has been in a read operational mode or a write operational mode before an active operational mode, then the read clock control signal 'RD_CLK_CTRL' and the write clock control signal 'WT_CLK_CTRL' can be maintained at an activated state in the current active operational mode.

However, if the write-read clock control signal generating unit 100 has been in an idle mode or a refresh operational mode before an active operational mode, then the read clock control signal 'RD_CLK_CTRL' and the write clock control signal 'WT_CLK_CTRL' can be maintained at a deactivated state in the current active operational mode.

In addition, a specific dedicated clock (for a read operation or a write operation) can be generally provided in a specific test mode. However, a specific test mode applying unit can be additionally provided so that current consumption can be reduced in an idle mode.

Figure 4:
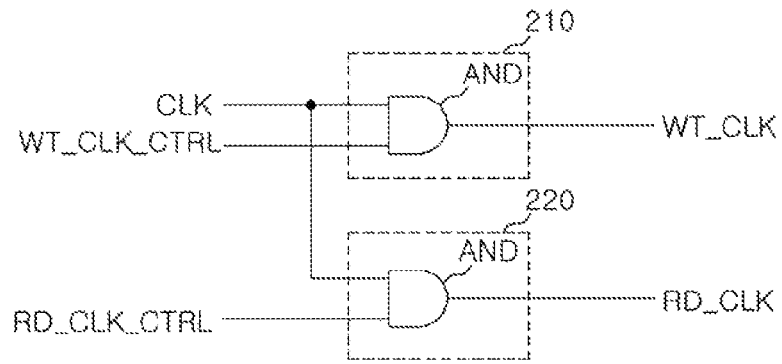
FIG. 4 is a schematic circuit diagram of an exemplary clock buffer that can be included in the device of FIG. 2 according to one embodiment.

FIG. 4 is a schematic circuit diagram of an exemplary clock buffer of FIG. 2 according to one embodiment. In FIG. 4, the clock buffer 200 can be configured to include a first combining unit 210 and a second combining unit 220. The clock buffer 200 can divide a path of the clock signal 'CLK' in response to the read clock control signal 'RD_CLK_CTRL' and the write clock control signal 'WT_CLK_CTRL' to generate the read clock signal 'RD_CLK' and the write clock signal 'WT_CLK'.

The first combining unit 210 can generate the write clock signal 'WT_CLK' by combining the clock signal 'CLK' and the write clock control signal 'WT_CLK_CTRL'. The first combining unit 210 can also include an AND gate. Accordingly, while the write clock control signal 'WT_CLK_CTRL' is being activated, the write clock signal 'WT_CLK' having the same period as that of the clock signal 'CLK' can be generated. For example, if the first combining unit 210 receives the write clock control signal 'WT_CLK_CTRL' that is deactivated, then the first combining unit 210 can generate the write clock signal 'WT_CLK' that is deactivated.

The second combining unit 220 can generate the read clock signal 'RD_CLK' by combining the clock signal 'CLK' and the read clock control signal 'RD_CLK_CTRL'. The second combining unit 220 can also include an AND gate. Accordingly, while the read clock control signal 'RD_CLK_CTRL' is being activated, the read clock signal 'RD_CLK' having the same period as that of the clock signal 'CLK' can be generated. For example, if the second combining unit 220 receives the read clock control signal 'RD_CLK_CTRL' that is deactivated, then the first combining unit 210 can generate the read clock signal 'RD_CLK' that is deactivated.

Figure 5:
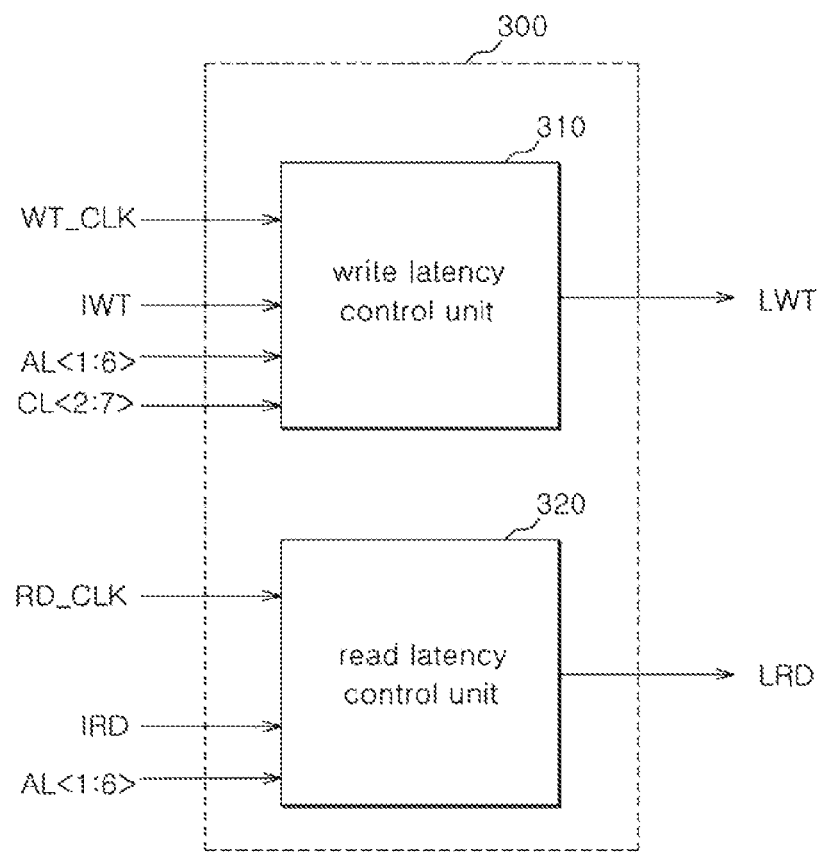
FIG. 5 is a schematic block diagram of an exemplary latency control unit controlled by read/write clock signals and that can be included in the device of FIG. 2 according to one embodiment.

FIG. 5 is a schematic block diagram of an exemplary latency control unit controlled by read/write clock signals of FIG. 2 according to one embodiment. In FIG. 5, the latency control unit 300 can be configured to include a write latency control unit 310 and a read latency control unit 320. The write latency control unit 310 can generate a write latency signal 'LWT' in response to the write clock signal 'WT_CLK', an internal write command 'IWT', an adaptive latency signal 'AL<1:6>' for write latency, and a CAS latency signal 'CL<2:7>'. Here, the write latency signal 'LWT' can control activation timing of column signals, i.e., a column strobe signal 'YS', in a write operational mode.

The read latency control unit 320 can generate a read latency signal 'LRD' in response to the read clock signal 'RD_CLK', an internal read command signal 'IRD', and a read latency signal, i.e., an adaptive latency signal 'AL<1:6>'. Here, the read latency signal 'LRD' can control activation timing of column signals in a read operational mode.

Figure 6:
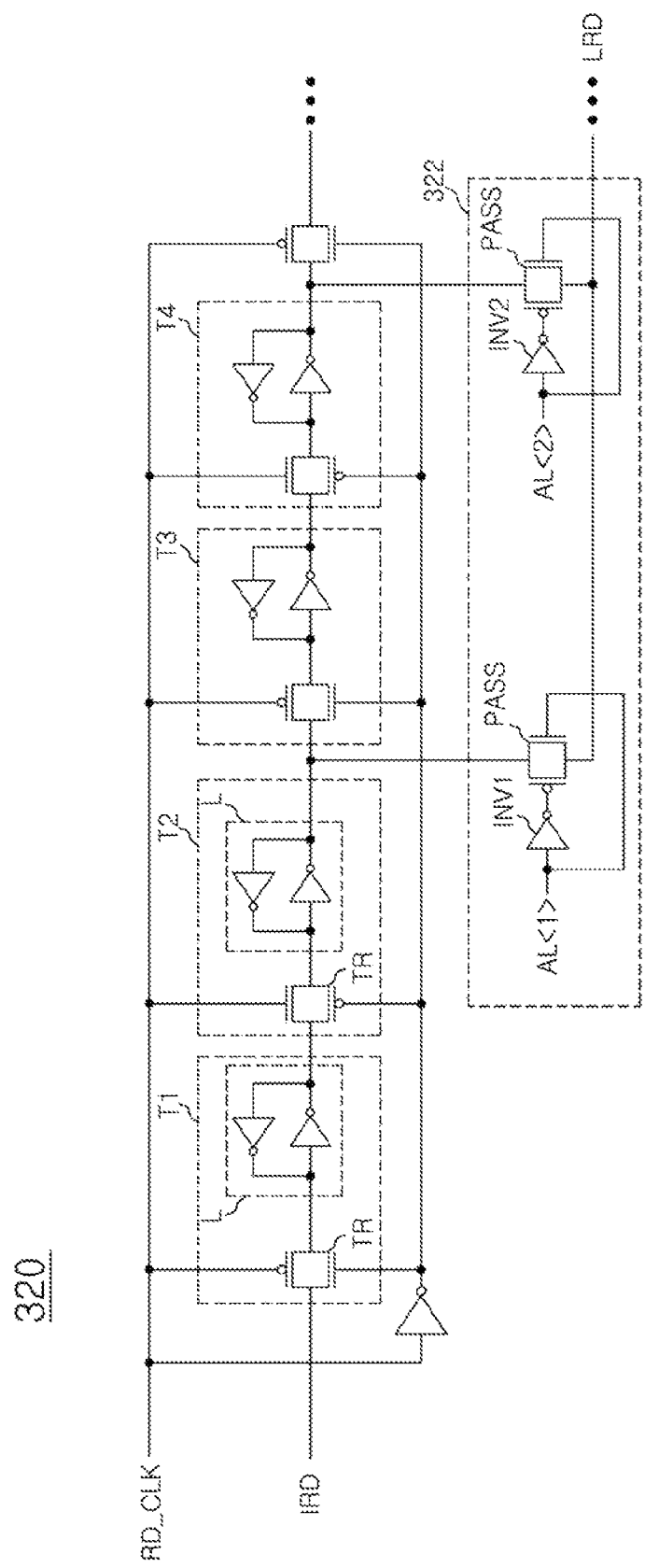
FIG. 6 is a schematic circuit diagram of an exemplary read latency control unit of FIG. 5 according to one embodiment.

FIG. 6 is a schematic circuit diagram of an exemplary read latency control unit of FIG. 5 according to one embodiment. In FIG. 6, the read latency control unit 320 can be configured to include a plurality of transfer units T1, T2, T3, . . . , and Tn, and a latency activating unit 322. The read latency control unit 320 can receive the internal read command signal 'IRD', and can delay the internal read command signal 'IRD' by a predetermined clock cycle corresponding the adaptive latency signal 'AL<1:6>' in response to the adaptive latency signal 'AL<1:6>', thereby generating the read latency signal 'LRD'.

Each of the transfer units T1, T2, T3, . . . , and Tn can include a transfer gate TR and a latch L. The transfer unit T1 can receive and transfer the internal read command 'IRD' in synchronization with a falling edge of the read clock signal 'RD_CLK'. The transfer gate TR can be turned ON in response to a low level of the read clock signal 'RD_CLK'. Here, the latch unit L can latch a signal transferred from the transfer gate TR.

The transfer unit T2 can receive and transfer the signal from the transfer unit T1 in synchronization with a rising edge of the read clock signal 'RD_CLK'. The transfer gate TR can be turned ON in response to a high level of the read clock signal 'RD_CLK'. Here, the latch unit L can latch a signal transferred from the transfer gate TR.

Similarly, the transfer unit T3 can receive and transfer a signal from the transfer unit T2 in synchronization with a falling edge of the read clock signal 'RD_CLK'. The transfer gate TR can be turned ON in response to a low level of the read clock signal 'RD_CLK'. Here, the latch unit L can latch a signal transferred from the transfer gate TR.

As described above, each of the transfer units T1, T2, T3, . . . , and Tn can be alternatively turned ON/OFF in response to the read clock signal 'RD_CLK'. Accordingly, the transfer units T1 and T3 or the transfer units T2 and T4 can be turned ON so that a time to transfer a signal can be delayed by one clock cycle corresponding to each pair of the turned-ON transfer unit and the turned-OFF transfer unit.

In FIG. 6, the latency activating unit 322 can provide an output signal of the transfer units T1, T2, T3, . . . , and Tn as the read latency signal 'LRD' in response to the read latency of the semiconductor IC device, i.e., the adaptive latency signal 'AL<1:6>'. The latency activating unit 322 can include a plurality of pass gates PASS and inverters INV1, INV2, . . . , and INVn that can receive the adaptive latency signal 'AL<1:6>'.

An exemplary operation of the latency activating unit 322 will be described. If the adaptive latency signal is a "1", then the adaptive latency signal 'AL<1>' may be activated at a high level. Accordingly, the pass gate PASS that receives the activated adaptive latency signal 'AL<1>' can be turned ON such that the output signal of the transfer unit T2 can be provided as the read latency signal 'LRD'. The signal elapse time of the transfer units T1 and T2, or the third and fourth transfer units T3 and T4, can be delayed by one clock cycle. Thus, if the adaptive latency signal is "1", then the read latency signal 'LRD' may be generated after being delayed from the activation time of the internal read command 'IRD' by one clock cycle.

If the adaptive latency signal is a "2", then the adaptive latency signal 'AL<2>' can be activated at a high level. Accordingly, the pass gate PASS receiving the activated adaptive latency signal 'AL<2>' can be turned ON such that the output signal of the transfer unit T4 can be provided as the read latency signal 'LRD'. Thus, since the adaptive latency is a "2", the read latency signal 'LRD' may be generated after being delayed from the activation time of the internal read command signal 'IRD' by two clock cycles.

For the purpose of explanation, although the read latency control unit 320 is described, the write latency control unit 310 can have substantially the same structure and operational principles as those of the read latency control unit 320. However, the write latency control unit 310 can employ an additional latency activating unit responding to the CAS latency.

As described above, the read clock control signal 'RD_CLK_CTRL' and the write clock control signal 'WT_CLK_CTRL', which can be activated in the write operational mode and the read operational mode, respectively, can be generated. In addition, the read clock control signal 'RD_CLK_CTRL' and the write clock control signal 'WT_CLK_CTRL' can be deactivated in the idle mode and the refresh operational mode, thereby reducing current consumption in the idle mode. In addition, the flip-flop type latch unit can be used. Accordingly, if the idle mode or the refresh operational mode is activated, then the read clock signal 'RD_CLK' and the write clock signal 'WT_CLK' can be maintained at a previous state, i.e., a state of the idle mode or the refresh operational mode, in the following active operational mode. Thus, the read clock signal 'RD_CLK' and the write clock signal 'WT_CLK' may not be activated. As a result, current consumption of a semiconductor IC device can be reduced.

According to one embodiment, in order to perform a specific test, a write clock signal is not driven from an idle mode, but activated only when a necessary test mode is reached. For example, read and write clock control signals can be deactivated in the idle mode, so that a standby current can be reduced. In addition, since a flip-flop type latch unit can be used, read and write clock signals may be deactivated even in an active operational mode, if necessary, thereby reducing current consumption of a semiconductor IC device. For example, if the idle mode or the refresh operational mode is activated, then the read and write clock signals may be deactivated in the following active operational mode. Accordingly, current consumption of a semiconductor IC device can be reduced.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor integrated circuit, comprising:
   a write-read clock control signal generating unit that activates a read clock control signal and a write clock control signal in response to one of a read operational mode and a write operational mode after maintaining the read clock control signal and the write clock control signal at a deactivation state in response to one of an idle mode and a refresh mode; and
   a clock buffer that generates a read clock signal and a write clock signal in response to a clock signal, the read clock control signal, and the write clock control signal, wherein
   the write-read clock control signal generating unit includes:
      a set-up unit that generates a command control signal activated in response to one of the read operational mode and the write operational mode;
      a latch unit that generates the read clock control signal and the write clock control signal in response to the command control signal; and
      a reset unit that resets the latch unit by supplying a reset signal activated in response to one of the idle mode and the refresh mode.

2. The semiconductor integrated circuit of claim 1, wherein the latch unit deactivates the read clock control signal and the write clock control signal if the activated reset signal is received, after maintaining the read clock control signal and the write clock control signal at an activation state if the activated command control signal is received.

3. The semiconductor integrated circuit of claim 2, wherein the latch unit includes a plurality of NAND gates provided in a flip-flop configuration.

4. The semiconductor integrated circuit of claim 1, wherein the clock buffer includes:
   a first combining unit that generates the write clock signal by combining the clock signal and the write clock control signal; and
   a second combining unit that generates the read clock signal by combining the clock signal and the read clock control signal.

5. The semiconductor integrated circuit of claim 1, wherein the idle mode includes a precharge mode and a power down mode.

* * * * *